US011133051B2

(12) United States Patent
Jin et al.

(10) Patent No.: US 11,133,051 B2
(45) Date of Patent: *Sep. 28, 2021

(54) MEMORY DEVICES AND METHODS OF CONTROLLING AN AUTO-REFRESH OPERATION OF THE MEMORY DEVICES

(71) Applicant: SK hynix Inc., Icheon-si (KR)

(72) Inventors: Youngjae Jin, Seoul (KR); Jin Wook Kim, Yongin-si (KR)

(73) Assignee: SK hynix inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/064,111

(22) Filed: Oct. 6, 2020

(65) Prior Publication Data

US 2021/0020230 A1  Jan. 21, 2021

Related U.S. Application Data

(63) Continuation of application No. 16/218,225, filed on Dec. 12, 2018, now Pat. No. 10,832,755.

(30) Foreign Application Priority Data

Apr. 9, 2018 (KR) .................. 10-2018-0041153

(51) Int. Cl.
*G11C 11/406* (2006.01)

(52) U.S. Cl.
CPC ... *G11C 11/40611* (2013.01); *G11C 11/40626* (2013.01); *G11C 2211/4061* (2013.01); *G11C 2211/4068* (2013.01)

(58) Field of Classification Search
CPC ......... G11C 11/40611; G11C 11/40626; G11C 11/401; G11C 11/406; G11C 11/40615;
(Continued)

(56) References Cited

U.S. PATENT DOCUMENTS 8,228,736 B2   7/2012   Joo et al.
2009/0083479 A1*   3/2009   Lee .................. G11C 11/406
                                                        711/106
(Continued)

FOREIGN PATENT DOCUMENTS

KR          100855578 B1     9/2008
KR       1020090016522 A     2/2009

*Primary Examiner* — Alfredo Bermudez Lozada
(74) *Attorney, Agent, or Firm* — William Park & Associates Ltd.

(57) ABSTRACT

A memory device may include a memory medium and a memory controller. The memory medium may be configured to perform a self-refresh operation and an auto-refresh operation in response to a self-refresh signal and an auto-refresh control signal, respectively. The memory controller may be configured to control the auto-refresh operation by transmitting the auto-refresh control signal to the memory medium. The memory medium includes a self-refresh controller. The self-refresh controller may be configured to control the self-refresh operation based on a self-refresh cycle varying according to an internal temperature of the memory medium and transmit the self-refresh signal to the memory controller. The memory controller may be configured to generate the auto-refresh control signal based on an auto-refresh cycle. The auto-refresh control signal may be determined by the self-refresh signal transmitted from the memory medium.

8 Claims, 4 Drawing Sheets

(58) Field of Classification Search
CPC ...... G11C 2211/406; G11C 2211/4061; G11C 2211/4068
See application file for complete search history.

(56) References Cited

U.S. PATENT DOCUMENTS

2010/0142291 A1* 6/2010 Joo .................... G06F 1/206
                                                    365/189.15
2017/0133086 A1* 5/2017 Jung ............... G11C 11/40626
2017/0287548 A1* 10/2017 Ishikawa .......... G11C 11/40626

* cited by examiner

MEMORY DEVICES AND METHODS OF CONTROLLING AN AUTO-REFRESH OPERATION OF THE MEMORY DEVICES

CROSS-REFERENCE TO RELATED APPLICATIONS

The present application is a continuation application of U.S. patent application Ser. No. 16/218,225 filed on Dec. 12, 2018, which claims priority under 35 U.S.C 119(a) to Korean Application No. 10-2018-0041153, filed on Apr. 9, 2018, which is herein incorporated by references in its entirety.

BACKGROUND

1. Technical Field

Various embodiments of the present disclosure relate to memory devices and, more particularly, to memory devices and methods of controlling an auto-refresh operation of the memory devices.

2. Related Art

In general, semiconductor memory devices are typically categorized as either volatile memory devices or nonvolatile memory devices according to whether data stored in their memory cells are lost or retained when their power supplies are interrupted. The volatile memory devices that lose stored data when the power supplies are interrupted may include static random access memory (SRAM) devices and dynamic random access memory (DRAM) devices. A unit cell of the SRAM devices may include a flip flop circuit (e.g., two cross-coupled inverters) and two switching elements. Thus, the SRAM cells may stably retain their data due to a feedback effect of the flip flop circuit as long as their power supplies are supplied. Meanwhile, a unit cell of the DRAM devices may include a cell transistor acing as a switching element and a cell capacitor acting as a data storage element. If the cell transistor is turned on, a datum may be stored into the cell capacitor through the cell transistor.

In the DRAM devices, leakage currents may flow through the cell transistors even though the cell transistors are turned off. Thus, the data (e.g., charges) stored in the capacitors may be lost as time elapses even if their power supplies are supplied. Thus, the cell capacitors need to be periodically recharged to retain their stored data. This operation for recharging the cell capacitors is referred to as a refresh operation.

The refresh operation may be categorized as either an auto-refresh operation or a self-refresh operation. The auto-refresh operation may be executed by auto-refresh commands outputted from a memory controller, and the self-refresh operation may be executed by self-refresh signals which are internally generated in the DRAM devices. The self-refresh operation may be periodically executed according to a self-refresh cycle time which is set in the DRAM devices. In such a case, the self-refresh cycle time may be set to be variable according to an internal temperature of the DRAM devices. For example, if the internal temperature of the DRAM devices increases, the self-refresh cycle time needs to be reduced. In contrast, if the internal temperature of the DRAM devices is lowered, the self-refresh cycle time needs to increase to reduce the power consumption of the DRAM devices.

SUMMARY

According to an embodiment, a memory device may include a memory medium and a memory controller. The memory medium may be configured to perform a self-refresh operation and an auto-refresh operation in response to a self-refresh signal and an auto-refresh control signal, respectively. The memory controller may be configured to control the auto-refresh operation by transmitting the auto-refresh control signal to the memory medium. The memory medium includes a self-refresh controller. The self-refresh controller may be configured to control the self-refresh operation based on a self-refresh cycle varying according to an internal temperature of the memory medium and transmit the self-refresh signal to the memory controller. The memory controller may be configured to generate the auto-refresh control signal based on an auto-refresh cycle. The auto-refresh control signal may be determined by the self-refresh signal transmitted from the memory medium.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments may be directed to memory devices and methods of controlling an auto-refresh operation of the memory devices.

Figure 1:
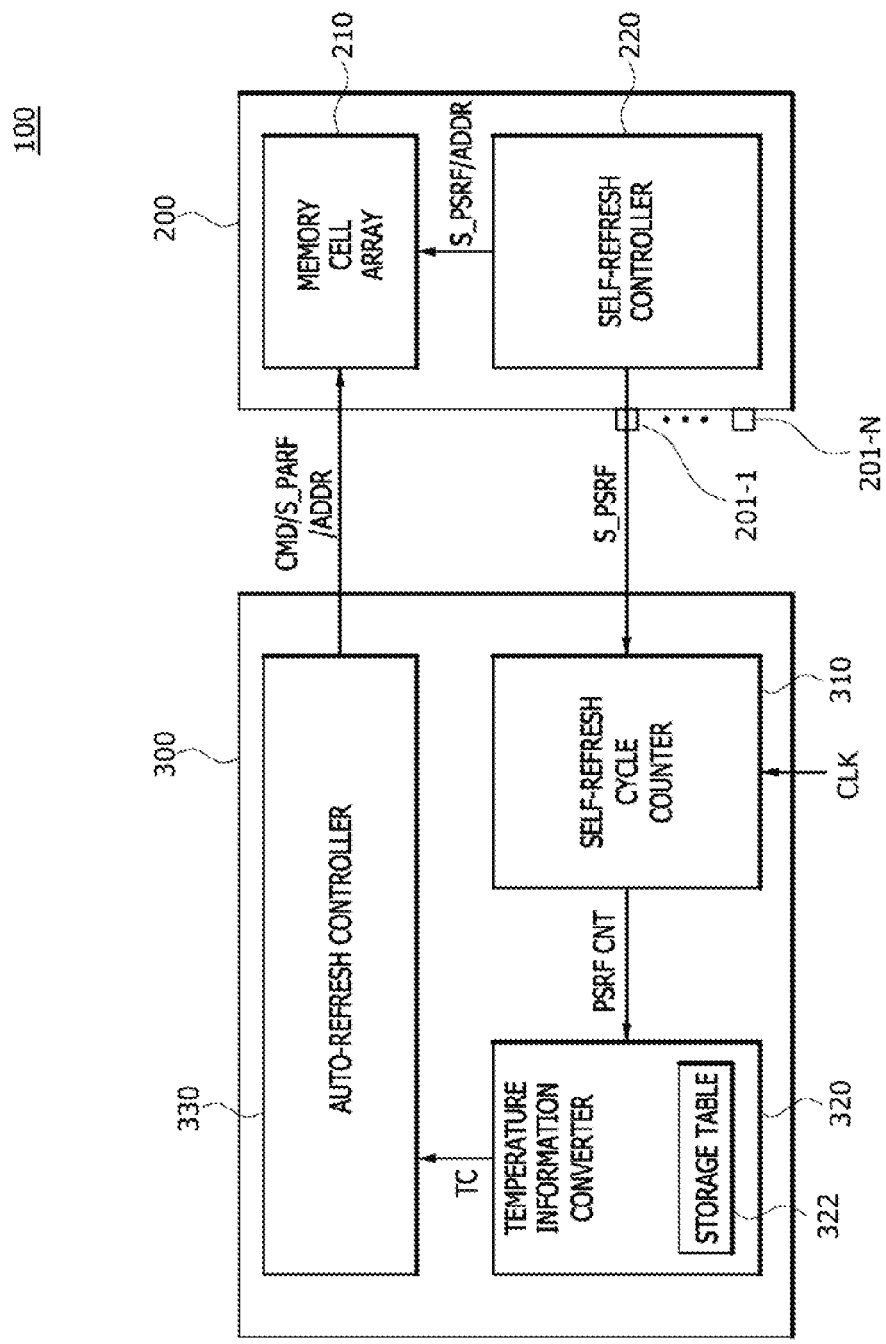
FIG. 1 is a block diagram illustrating a memory device according to an embodiment of the present disclosure.
Figure 2:
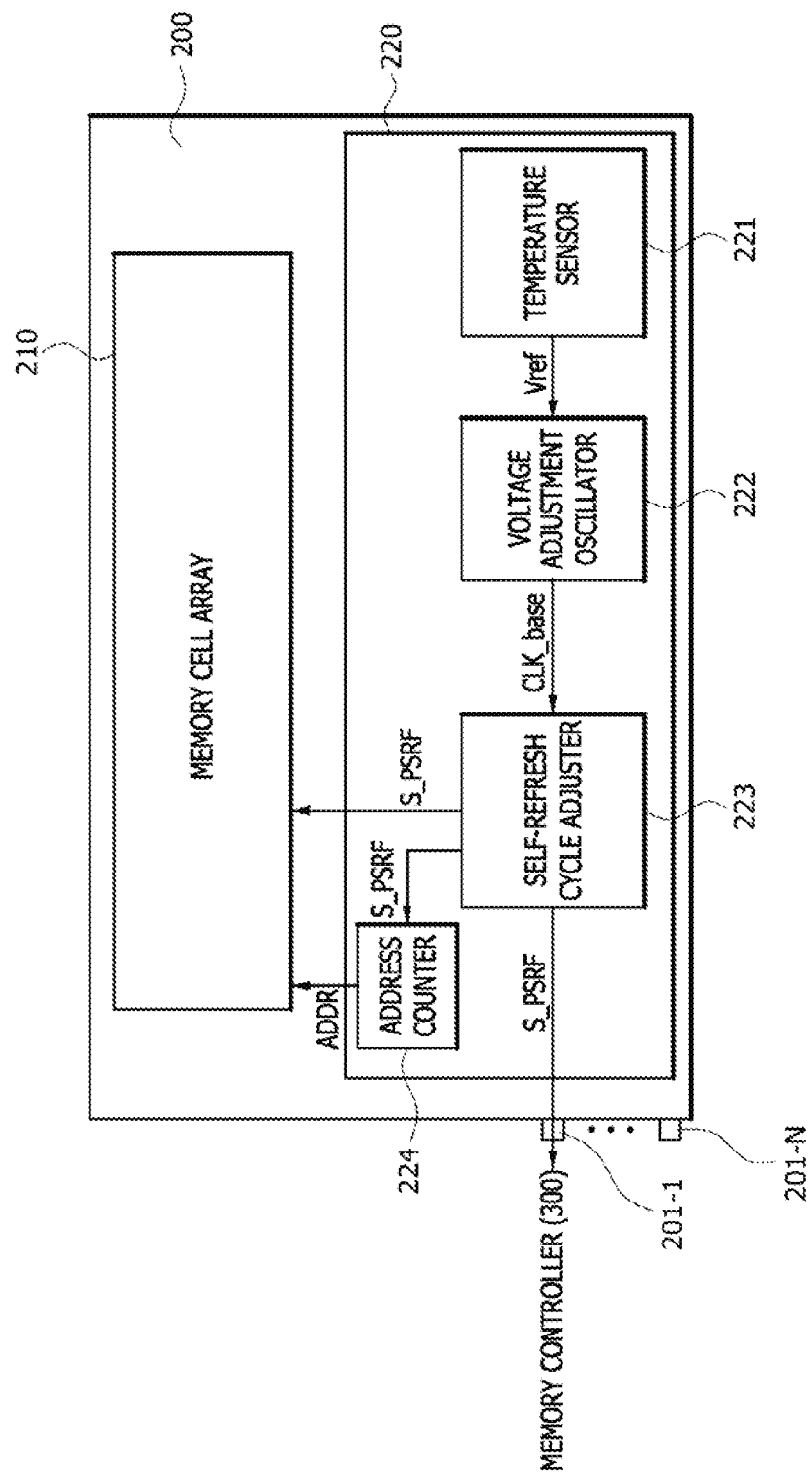
FIG. 2 is a block diagram illustrating an example of a memory medium included in the memory device of FIG. 1.

FIG. 1 is a block diagram illustrating a memory device 100 according to an embodiment of the present disclosure, and FIG. 2 is a block diagram illustrating an example of a memory medium 200 included in the memory device 100 of FIG. 1. Referring to FIG. 1, the memory device 100 may be configured to include the memory medium 200 and a memory controller 300. In an embodiment, the memory medium 200 may be realized using a DRAM device. The memory medium 200 may include a memory cell array 210 and a self-refresh controller 220. If the memory medium 200 is a DRAM device, the memory cell array 210 may include a plurality of unit cells, each of which is comprised of a cell transistor and a cell capacitor. The self-refresh controller 220 may generate a self-refresh signal S_PSRF and an address ADDR. The self-refresh controller 220 may transmit the self-refresh signal S_PSRF and the address ADDR to the memory cell array 210 such that the memory cell array 210 performs a self-refresh operation of a unit cell having the address ADDR. The self-refresh signal S_PSRF may be a periodic signal having a certain cycle. Thus, the self-refresh signal S_PSRF may be transmitted in the form of a one-bit pulse signal. The self-refresh controller 220 may also transmit the self-refresh signal S_PSRF to the memory controller 300. Since the self-refresh signal S_PSRF is transmitted in the form of a one-bit pulse signal, only one path may be required to transmit the self-refresh signal S_PSRF from the memory medium 200 to the memory controller 300. If the memory medium 200 is a chip having a plurality of output pins 201-1, . . . , 201-N, the self-refresh signal S_PSRF may be transmitted through an unused output pin 201-1 among the plurality of output pins of the memory medium 200. A self-refresh cycle (PSRF of FIG. 3) corresponding to a cycle of the self-refresh signal S_PSRF generated by the self-refresh controller 220 of the memory medium 200 may be set to vary according to an internal temperature of the memory medium 200.

As illustrated in FIG. 2, the self-refresh controller 220 of the memory medium 200 may be configured to include a temperature sensor 221, a voltage adjustment oscillator 222, a self-refresh cycle adjuster 223 and an address counter 224. The temperature sensor 221 may output a voltage signal Vref corresponding to the internal temperature of the memory medium 200. In an embodiment, the voltage signal Vref outputted from the temperature sensor 221 may be an analog voltage signal that is proportional to the internal temperature of the memory medium 200. The voltage adjustment oscillator 222 may receive the voltage signal Vref to generate and output a base clock signal CLK_base. The base clock signal CLK_base outputted from the voltage adjustment oscillator 222 may be generated to have a frequency that varies according to the voltage signal Vref outputted from the temperature sensor 221. In an embodiment, the voltage adjustment oscillator 222 may output the base clock signal CLK_base having a relatively low frequency at a low temperature and may output the base clock signal CLK_base having a relatively high frequency at a high temperature.

The self-refresh cycle adjuster 223 may receive the base clock signal CLK_base to generate the self-refresh signal S_PSRF. The self-refresh cycle (PSRF of FIG. 3) corresponding to a cycle of the self-refresh signal S_PSRF may be generated by applying a predetermined division factor to the base clock signal CLK_base. For example, the self-refresh cycle adjuster 223 may be designed to have the predetermined division factor, and the self-refresh signal S_PSRF may be generated to have a frequency that is obtained by multiplying the predetermined division factor by a cycle of the base clock signal CLK_base. The self-refresh cycle (PSRF of FIG. 3) may correspond to a reciprocal number of a frequency of the self-refresh signal S_PSRF. Because a cycle of the base clock signal CLK_base varies according to the internal temperature of the memory medium 200, the self-refresh cycle (PSRF of FIG. 3) corresponding to a cycle of the self-refresh signal S_PSRF may also vary according to the internal temperature of the memory medium 200. The self-refresh cycle adjuster 223 may output the self-refresh signal S_PSRF to the address counter 224, the memory cell array 210 and the memory controller 300. The address counter 224 may generate the address ADDR in response to the self-refresh signal S_PSRF and may output the address ADDR to the memory cell array 210. The memory cell array 210 may perform the self-refresh operation of the unit cells located at the address ADDR.

The word "predetermined" as used herein with respect to a parameter, such as a predetermined division factor, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Referring again to FIG. 1, the memory controller 300 may be configured to include a self-refresh cycle counter 310, a temperature information converter 320 and an auto-refresh controller 330. The self-refresh cycle counter 310 may receive the self-refresh signal S_PSRF outputted from the self-refresh controller 220 of the memory medium 200 and may count the number of pulses, which are generated for one cycle of the self-refresh signal S_PSRF, to output the number of the pulses as a counted value PSRF_CNT. The counted value PSRF_CNT may be inputted to the temperature information converter 320. In order to count the number of the pulses generated for one cycle of the self-refresh signal S_PSRF, the self-refresh cycle counter 310 may receive a clock signal CLK having the pulses. The clock signal CLK may be generated by the memory controller 300 or an external device or an external system. That is, the self-refresh cycle counter 310 may compare the self-refresh signal S_PSRF with the clock signal CLK to generate the counted value PSRF_CNT for calculating the self-refresh cycle (PSRF of FIG. 3).

Figure 3:
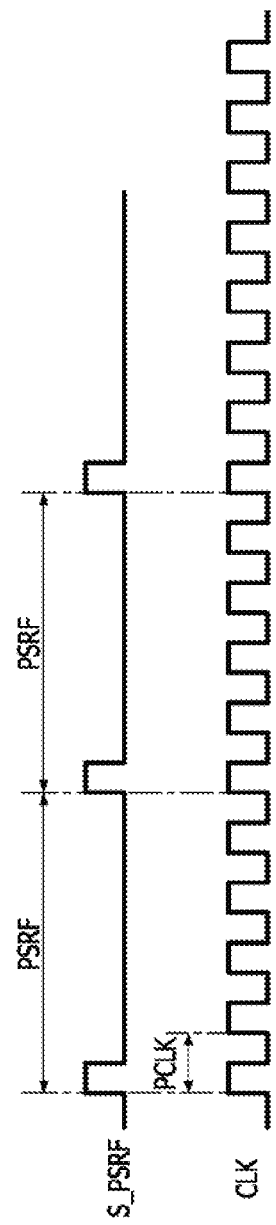
FIG. 3 is a timing diagram illustrating an operation of a self-refresh cycle counter included in the memory device of FIG. 1.

FIG. 3 is a timing diagram illustrating an operation of the self-refresh cycle counter 310 included in the memory device 100 of FIG. 1. Referring to FIG. 3, the self-refresh signal S_PSRF inputted to the self-refresh cycle counter 310 may be a one-bit pulse signal that normally toggles between a logic "high" level and a logic "low" level. A cycle of the self-refresh signal S_PSRF means the self-refresh cycle PSRF illustrated in FIG. 3. That is, the self-refresh cycle PSRF may be defined as a time interval between two adjacent rising edges (or two adjacent falling edges) of the self-refresh signal S_PSRF. Since the memory controller 300 cannot directly calculate the self-refresh cycle PSRF using only the self-refresh signal S_PSRF, the memory controller 300 may compare the self-refresh signal S_PSRF with the clock signal CLK to obtain the self-refresh cycle PSRF. If the clock signal CLK has a first cycle PCLK, the self-refresh cycle PSRF of the self-refresh signal S_PSRF may be five times the first cycle PCLK of the clock signal CLK, as illustrated in FIG. 3. Accordingly, the self-refresh cycle counter 310 may output a binary number corresponding to a decimal number of five as the counted value PSRF_CNT.

Referring again to FIG. 1, the temperature information converter 320 may receive the counted value PSRF_CNT to generate a temperature code TC and may output the temperature code TC to the auto-refresh controller 330. The temperature code TC outputted from the temperature information converter 320 may be determined by data stored in a storage table 322 disposed in the temperature information converter 320. In order that the temperature information converter 320 generate the temperature code TC, the storage table 322 may previously store various temperature codes TC respectively matched with various counted values PSRF_CNT. The auto-refresh controller 330 may receive the temperature code TC to generate an auto-refresh control signal CMD/S_PARF/ADDR and may output the auto-refresh control signal CMD/S_PARF/ADDR to the memory cell array 210. The auto-refresh control signal CMD/S_PARF/ADDR may include a command CMD for an auto-refresh operation, an auto-refresh signal S_PARF, and an address ADDR. An auto-refresh cycle PARF corresponding to a cycle of the auto-refresh signal S_PARF may be influenced and determined by the self-refresh cycle PSRF (of the self-refresh signal S_PSRF) that varies according to the internal temperature of the memory medium 200. Thus, the self-refresh cycle PSRF may be determined even without any extra temperature information outputted from the memory medium 200 and any extra process steps for processing the extra temperature information, for example, a process step for processing a command for requesting the temperature information and a process step for accessing the temperature information of the memory medium 200.

Figure 4:
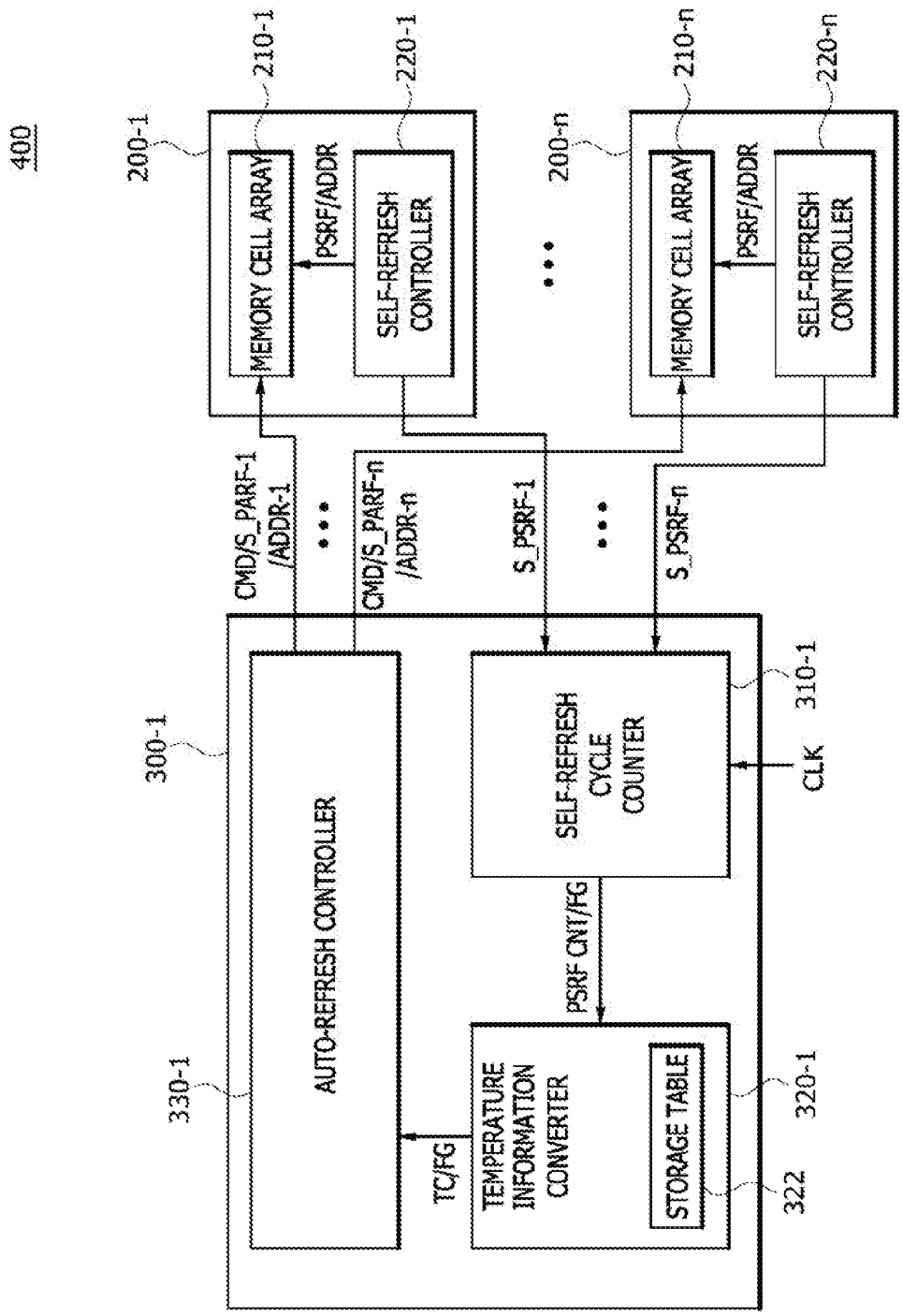
FIG. 4 is a block diagram illustrating a memory device according to other embodiments of the present disclosure.

FIG. 4 is a block diagram illustrating a memory device 400 according to other embodiments of the present disclosure. Referring to FIG. 4, the same reference numerals as used in FIG. 1 denote the same elements, and the same terms as used in FIG. 1 also denote substantially the same elements in terms of function. Thus, detailed descriptions of the same elements as set forth with reference to FIG. 1 are omitted to avoid a repeated description. Referring to FIG. 4, the memory device 400 may be configured to include a plurality of memory medium (e.g., first to $N^{th}$ memory medium 200-1, . . . and 200-$n$) and a memory controller 300-1. Each of the first to $N^{th}$ memory medium 200-1, . . . and 200-$n$ may be configured to have a memory chip form employed in a memory module. Each of the first to $N^{th}$ memory medium 200-1, . . . and 200-$n$ may have the same configuration. The first memory medium 200-1 may include a memory cell array 210-1 and a self-refresh controller 220-1. Similarly, the $N^{th}$ memory medium 200-$n$ may include a memory cell array 210-$n$ and a self-refresh controller 220-$n$. Each of the memory cell arrays 210-1, . . . and 210-$n$ may have substantially the same configuration as the memory cell array 210 described with reference to FIGS. 1 and 2, and each of the self-refresh controllers 220-1, . . . and 220-$n$ may have substantially the same configuration as the self-refresh controller 220 described with reference to FIGS. 1 and 2. Thus, the self-refresh controller 220-1 of the first memory medium 200-1 may generate a first self-refresh signal S_PSRF-1 which is set by the internal temperature of the first memory medium 200-1. Similarly, the self-refresh controller 220-$n$ of the $N^{th}$ memory medium 200-$n$ may generate an $N^{th}$ self-refresh signal S_PSRF-n which is set by the internal temperature of the $N^{th}$ memory medium 200-$n$.

The memory controller 300-1 may be integrated in one memory module together with the first to $N^{th}$ memory medium 200-1, . . . and 200-$n$. Alternatively, the memory controller 300-1 may be disposed separately from a memory module comprised of the first to $N^{th}$ memory medium 200-1, . . . and 200-$n$. The memory controller 300-1 may be configured to include a self-refresh cycle counter 310-1, a temperature information converter 320-1 and an auto-refresh controller 330-1. The self-refresh cycle counter 310-1 may receive the first to $N^{th}$ self-refresh signals S_PSRF-1, . . . and S_PSRF-n outputted from the first to $N^{th}$ memory medium 200-1, . . . and 200-$n$. The self-refresh cycle counter 310-1 may count the number of pulses of a clock signal CLK for one cycle of any one of the first to $N^{th}$ self-refresh signals S_PSRF-1, . . . and S_PSRF-n to output the number of the pulses as a counted value PSRF_CNT and to output a flag signal FG informing which one of the first to $N^{th}$ memory medium 200-1, . . . and 200-$n$ corresponds to the counted value PSRF_CNT. The self-refresh cycle counter 310-1 may be designed to have substantially the same configuration as the self-refresh cycle counter 310 described with reference to FIG. 1. One difference between the self-refresh cycle counter 310 and the self-refresh cycle counter 310-1 is that the self-refresh cycle counter 310-1 includes a plurality of logic circuits independently counting the number of the pulses of the clock signal CLK for the first to $N^{th}$ self-refresh signals S_PSRF-1, . . . and S_PSRF-n whereas the self-refresh cycle counter 310 includes only one of the plurality of logic circuits.

The temperature information converter 320-1 may receive the counted value PSRF_CNT and the flag signal FG to generate a temperature code TC and may output the temperature code TC and the flag signal FG to the auto-refresh controller 330-1. The temperature code TC may be a code which is predetermined according to the counted value PSRF_CNT corresponding to a cycle of any one of the first to $N^{th}$ self-refresh signals S_PSRF-1, . . . and S_PSRF-n and is stored in the storage table 322 disposed in the temperature information converter 320-1. The auto-refresh controller 330-1 may output an auto-refresh control signal including an auto-refresh signal S_PARF corresponding to the temperature code TC to any one of the memory cell arrays, which is designated by the flag signal FG. For example, if the flag signal FG designates the first memory medium 200-1, the auto-refresh controller 330-1 may output a first auto-refresh control signal CMD/S_PARF-1/ADDR-1 to the memory cell array 210-1 of the first memory medium 200-1. An auto-refresh cycle corresponding to a cycle of a first auto-refresh signal S_PARF-1 included in the first auto-refresh control signal CMD/S_PARF-1/ADDR-1 may be influenced and determined by only a cycle of the first self-refresh signal S_PSRF-1 that varies according to the internal temperature of the first memory medium 200-1 regardless of the internal temperatures of the other memory medium (i.e., the second to $N^{th}$ memory medium 200-2, . . . and 200-$n$). Similarly, if the flag signal FG designates the $N^{th}$ memory medium 200-$n$, the auto-refresh controller 330-1 may output an $N^{th}$ auto-refresh control signal CMD/S_PARF-n/ADDR-n to the memory cell array 210-$n$ of the $N^{th}$ memory medium 200-$n$. An auto-refresh cycle corresponding to a cycle of an $N^{th}$ auto-refresh signal S_PARF-n included in the $N^{th}$ auto-refresh control signal CMD/S_PARF-n/ADDR-n may be influenced and determined by only a cycle of the $N^{th}$ self-refresh signal S_PSRF-n that varies according to the internal temperature of the $N^{th}$ memory medium 200-$n$ regardless of the internal temperatures of the other memory medium (i.e., the first to $(N-1)^{th}$ memory medium 200-1, . . . and 200-$(n-1)$). Accordingly, each of the first to $N^{th}$ memory medium 200-1, . . . and 200-$n$ may independently perform an auto-refresh operation based on an auto-refresh cycle determined by an internal temperature thereof.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:
1. A memory device comprising:
   a memory medium configured to perform a self-refresh operation and an auto-refresh operation in response to a self-refresh signal and an auto-refresh control signal, respectively; and a memory controller configured to control the auto-refresh operation by transmitting the auto-refresh control signal to the memory medium, wherein the memory medium includes a self-refresh controller, the self-refresh controller configured to control the self-refresh operation based on a self-refresh cycle varying according to an internal temperature of the memory medium and transmit the self-refresh signal to the memory controller, wherein the memory controller configured to generate the auto-refresh control signal based on an auto-refresh cycle which is determined by the self-refresh signal transmitted from the memory medium, and wherein the self-refresh cycle is determined by comparing the self-refresh signal with a clock signal.

2. The memory device of claim 1, wherein the memory controller is configured to determine the self-refresh cycle by comparing the self-refresh signal with a clock signal.

3. The memory device of claim 1, wherein the memory medium includes a plurality of output pins, and wherein the self-refresh signal is transmitted in the form of a one-bit pulse signal to the memory controller through an unused pin among the plurality of output pins of the memory medium.

4. The memory device of claim 1, wherein the self-refresh controller includes:

a temperature sensor configured to output a voltage signal having a voltage level corresponding to the internal temperature of the memory medium;

a voltage adjustment oscillator configured to generate a base clock signal, a frequency of the base clock signal varying according to the voltage level of the voltage signal;

a self-refresh cycle adjuster configured to apply a predetermined division factor to the base clock signal to generate the self-refresh signal; and an address counter configured to receive the self-refresh signal to generate a self-refresh address.

5. The memory device of claim 1, wherein the memory controller includes:

a self-refresh cycle counter configured to receive the self-refresh signal to generate a counted value corresponding to a cycle of the self-refresh signal;

a temperature information converter configured to receive the counted value to generate a temperature code corresponding to the counted value; and an auto-refresh controller configured to generate the auto refresh control signal for the auto-refresh operation performed by the memory medium based on the auto-refresh cycle varying according to the temperature code.

6. The memory device of claim 5, wherein the self-refresh signal is a one-bit pulse signal.

7. The memory device of claim 5, wherein the temperature information converter includes a storage table that stores the temperature code having a binary number form which is set to correspond to the counted value.

8. The memory device of claim 5, wherein the auto-refresh controller reduces the auto-refresh cycle if the temperature code increases and increases the auto-refresh cycle if the temperature code is reduced.

* * * * *